United States Patent

Rosin

[19]

[11] Patent Number: 6,031,378
[45] Date of Patent: Feb. 29, 2000

[54] MEASURING SYSTEM AND A METHOD FOR DETECTING STATIC ELECTRICITY AND/OR CHANGE THEREOF IN A MEASURING OBJECT AND USE THEREOF

[75] Inventor: Tomas Rosin, Turku, Finland

[73] Assignee: TR-Tech Int. Oy, Abo, Finland

[21] Appl. No.: 08/952,744

[22] PCT Filed: May 24, 1996

[86] PCT No.: PCT/FI96/00297

§ 371 Date: Nov. 13, 1997

§ 102(e) Date: Nov. 13, 1997

[87] PCT Pub. No.: WO96/37786

PCT Pub. Date: Nov. 28, 1996

[30] Foreign Application Priority Data

May 26, 1995 [FI] Finland .................................. 952562

[51] Int. Cl.⁷ .................................................. G01R 29/12
[52] U.S. Cl. ......................... 324/452; 324/457; 340/562
[58] Field of Search ................................. 324/452, 453, 324/454, 455, 456, 457, 72, 109; 340/561, 562, 567

[56] References Cited

U.S. PATENT DOCUMENTS

| | | | |
|---|---|---|---|
| 3,863,241 | 1/1975 | Kamiyamaguchi | 340/677 |
| 3,935,532 | 1/1976 | Shuey et al. | 324/72 |
| 3,943,437 | 3/1976 | Mourier | 324/72 |
| 4,063,154 | 12/1977 | Andrus et al. | 324/72 |
| 4,613,228 | 9/1986 | Suzuki et al. | 324/452 |
| 4,716,371 | 12/1987 | Blitshteyn | 324/457 |
| 4,740,862 | 4/1988 | Halleck | 324/455 |
| 5,019,804 | 5/1991 | Fraden | 340/562 |

FOREIGN PATENT DOCUMENTS

| | | |
|---|---|---|
| 1568811 | 4/1980 | United Kingdom . |
| 1586088 | 3/1981 | United Kingdom . |

*Primary Examiner*—Diep N. Do
*Attorney, Agent, or Firm*—Nixon & Vanderhye P.C.

[57] ABSTRACT

A method and a measuring system for detecting static electricity in a measuring object includes at least a sensor, a voltage meter, and a processor unit with a signal processing unit connected to the voltage meter. The sensor includes a sensing element arranged so that the electric field of the measuring object induces in the sensing element an electric signal which is proportional to the change in the electric charge of the measuring object. The sensor includes a detector including a capacitive circuit, such as a capacitor circuit, having an integrating effect on the measuring values which are read off by the voltage meter, connected between the sensing element and the voltage meter.

28 Claims, 2 Drawing Sheets

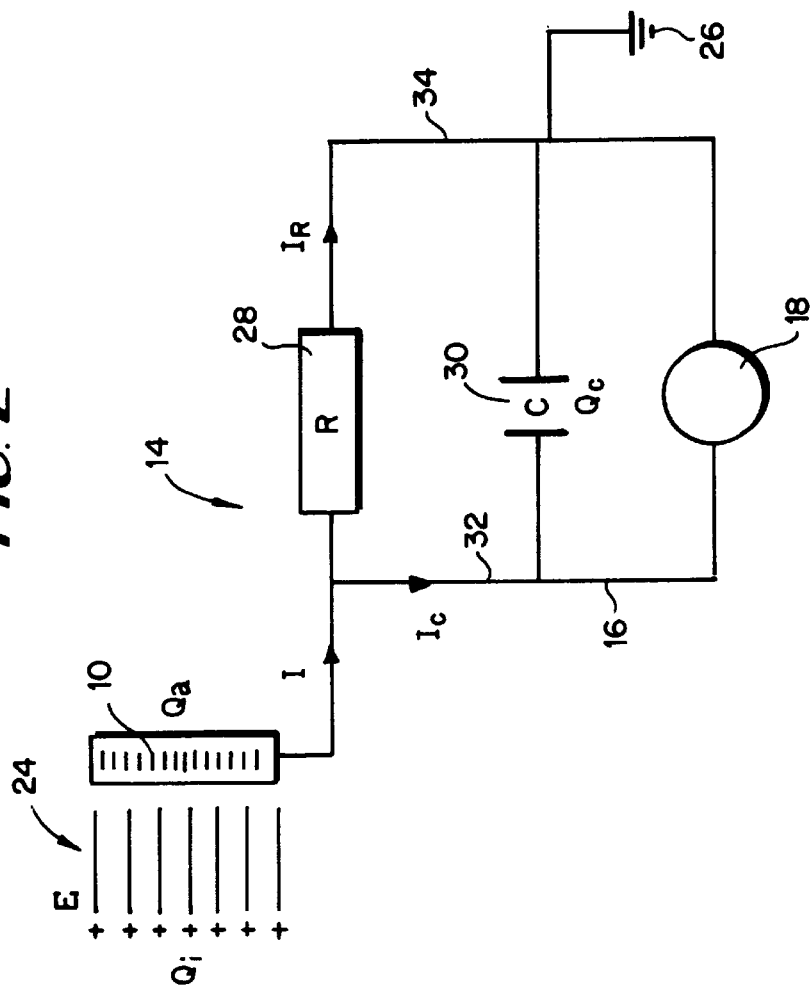
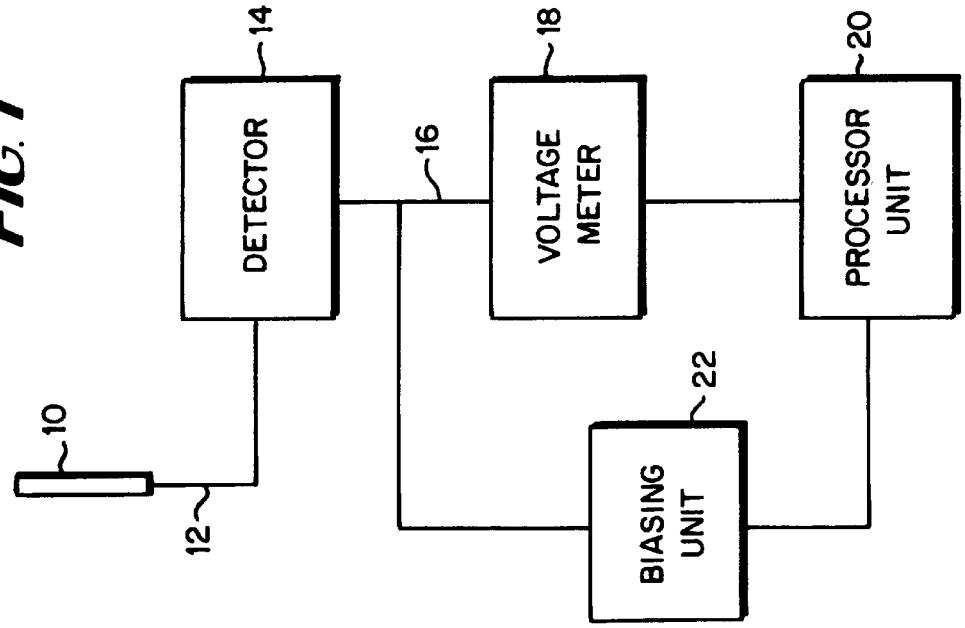
FIG. 2
FIG. 1

MEASURING SYSTEM AND A METHOD FOR DETECTING STATIC ELECTRICITY AND/OR CHANGE THEREOF IN A MEASURING OBJECT AND USE THEREOF

CROSS REFERENCE TO RELATED APPLICATION

This application is a U.S. national phase of PCT/F196/00297, filed May 24, 1996.

BACKGROUND AND SUMMARY OF THE INVENTION

The present invention relates to a measuring system and a method of detecting static electricity in a measuring object or test material as described more in detail in the preamble of the appended independent claims. The invention also relates to the use of the measuring system.

The above mentioned measuring system typically includes at least a sensor, a voltage meter and a processor unit with a signal processing unit connected to the voltage meter. The sensor of the measuring system comprises a sensing element, such as an antenna or an electrode, arranged so that the electric field of the measuring object or test material induces an electric signal in the sensing element indicating a change in electric charge which is proportional to the electric charge of the measuring object or test material. A detector is connected between the sensing element and the voltage meter. The detector consist typically of a capacitor circuit connected between the sensing element and the voltage meter, which transmits to the voltage meter the signal indicating a change in electric charge induced in the sensing element.

Simple reliable systems of this type suitable also for industrial processes have not as yet been available on the market.

A measuring system for measurement of electric charge in turbulent material flowing through a pipe, so as to find out the risk of explosions in the material, has been suggested in U.S. Pat. No. 3,753,102. Variations in the electric charge of the turbulent material which flows past an electrode are measured with an AC voltage meter. The AC component induced by the changes in the electric field is conducted directly via an AC amplifier and a rectifier to a DC voltage meter. The measuring system seems to be very sensitive, and requires protection against interference from external electric fields.

U.S. Pat. Nos. 4,370,616 and 5,151,659 disclose similar measuring systems with direct measurement of electric charges, in this case induced in rapidly oscillating electrodes arranged in a protecting opening in front of the surface the charge of which is to be measured. The measuring signal is amplified in an amplifier before the voltage meter. Even this measuring system is sensitive to interference. The measuring signal and all interference signals, if any, are amplified and read off.

U.S. Pat. No. 4,716,371 and British Patent Specification No.1 568 811 disclose similar measuring systems with capacitive circuits. These measuring systems seem to be highly sensitive to interference.

It is an object of the present invention to provide a new, reliable and as to its design simple measuring system for detecting electric charges in e.g. flowing powdery mediums, gas flows, or material webs in various kinds of processes, in order to obtain measuring values which can be used for controlling these processes.

It is a particular object of this invention to provide a measuring system and a method which is also suited for use in industrial processes under severe, e.g. dust-laden and/or interference-laden conditions.

It is a further object of this invention to provide a measuring system having an amply sufficient sensitivity to signals of low frequencies, e.g. in the order of 1–10 Hz.

It is a further object of the invention to provide a measuring system in which the influence of interference can be minimized.

The above stated objects are achieved by means of measuring systems and methods which are characterized by what have been stated in the characterizing part of the appended independent claims.

A measuring system according to the invention includes in the detector a capacitive or capacitor circuit having an integrating effect on the measuring signals which are conducted via the detector from the sensing element, i.e. the antenna or electrode, to the voltage meter. The measuring values from the voltage meter are processed and evaluated in an processor unit.

According to a preferred embodiment of the invention a resistor R is connected in parallel to the capacitor circuit having the capacitance C, so that the time constant $T=R*C$ of the capacitor circuit at discharging falls within the range of 0.01–5 s. The capacitor circuit will then have an integrating effect on the measuring signals (measuring values), which are conducted via the detector from the sensing element, i.e. the antenna or electrode, to the voltage meter, and are read by the voltage meter. The time constant for the recharging of the capacitor circuit is very small, negligible, because the resistance between the antenna and the capacitor is small. The time constant for the discharging is however made big by means of the resistor R, so that an integration of the measuring signals and a more even final measuring value is obtained. Thus, discrete signals are not measured, but integrated values of a larger number of signals. Integration of the measuring signals results in the fact that possible interference has less effect on the result. Interference at known frequencies can, if necessary, be filtered off.

In the measuring system according to the invention the resistance R in the detector circuit is chosen so as to be big, advantageously >1 Mohm, typically between 1–100 Mohm, and preferably >40 Mohm.

Also the capacitance has to be big, advantageously >1 nF, typically between 1–50 nF, and preferably 4–12 nF.

The time needed for the voltage U to be discharged to 63.2% over the capacitor C is called the time constant $T=R*C$ of the capacitor circuit. In a measuring system according to the invention, the resistance R and the capacitance C for the capacitor circuit are chosen so that the time constant falls within the range of 0.01–5 s, typically within the range of 0.1–1 s, and preferably within the range of 0.5–0.8 s. In a capacitor circuit having a big time constant, the voltage has not time to drop to the starting-point between two subsequent impulse-like measuring signals. This means that the capacitor circuit has an integrating effect and that all measuring values in this system are measured on a more even level in comparison with prior art measuring systems, which do not have a corresponding capacitor circuit with a big time constant.

In the measuring system according to the invention the measuring value of the voltage follows very rapidly a change of dE/dt. The time constant at a change of dE/dt is only a few microseconds because the resistance between the antenna and the capacitor is very small. If on the other hand dE/dt goes rapidly towards zero, the voltage over the capacitor goes slowly towards zero. The time constant at discharging is thereby big, e.g. 0.5–1 s.

The capacitor circuit enables the measuring system according to the invention to take into consideration also measuring values at low frequencies in spite of the fact that the measuring system by means of the processing of the signals can be made less sensitive to occasional interference, e.g. to hyper charged field or external fields, such as fields from electric motors or the like.

The measuring system according to the invention is a computerized measuring system for measurement of strength, changes and polarity of electric fields caused by electrostatically charged materials. A sensing element, here also called antenna, is arranged so that the electric field induces a charge concentration in the antenna. The antenna does not have to be in direct contact with the material the charge of which is to be measured. The charge can, depending on the design of the antenna and the magnitude of the charge, be measured even at a distance of 50 cm, preferably 20 cm. The magnitude of the measuring signal is proportional to the strength of the electric field. The functional principle is based on changes in the electric field and requires therefore a relative movement between the antenna and the measuring object.

BRIEF DESCRIPTION OF THE DRAWINGS

FIG. 1 shows schematically a block diagram of a measuring system according to the invention;

FIG. 2 shows schematically a coupling of an antenna and a detector according to the invention;

DETAILED DESCRIPTION OF THE DRAWINGS

Figure 3:
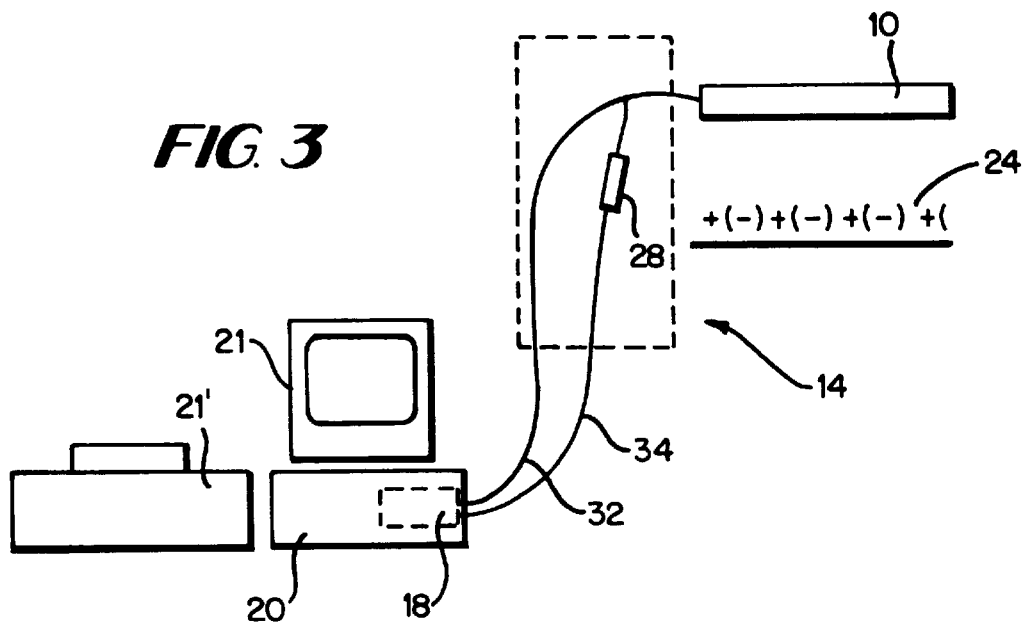
FIG. 3 shows schematically an embodiment of the measuring system according to the invention; and FIG: 4 shows schematically a coupling of a biasing circuit for a detector circuit for a measuring system according to the invention.

The measuring system according to the invention can be illustrated by the block diagram shown in FIG. 1. The measuring system includes an antenna 10, which through a wire 12 is connected to a detector unit 14. The detector unit 14 is through a cable 16 connected to a voltage meter 18, which in its turn is connected to a processor unit 20. A biasing unit 22 is arranged between the detector unit 14 and the processor unit 20. The processor unit includes an A/D converter, which converts the signals received from the voltage meter to digital form. The processor unit also includes the measuring logic, the signal processing unit, the evaluation of the measuring results and the biasing logic for the biasing unit.

FIG. 2 schematically illustrates an antenna 10 disposed in the vicinity of an electric field 24 having a positive charge $Q_i$. The electric field 24 induces a negative charge $Q_a$ in the antenna. The antenna 10 is via the detector 14 connected to the ground 26, whereby a current I is produced in the detector 14. The detector includes a capacitor circuit with a resistor (R) 28 and a capacitor (C) 30, which are connected by means of wires 32 and 34. The current I from the antenna is divided in fractional currents $I_C$ and $I_R$. The voltage (U) over the capacitor circuit is measured by a voltage meter 18.

According to the invention, the antenna 10, which is a conductor, can be of various geometric design depending on the measuring situation in question. The antenna can be made of the most suitable conducting material in any given case. The electric field of a material flowing in a pipe can e.g. in some cases be detected very simply by means of a normal screw inserted through a hole in the wall of the pipe. In the measuring system according to the invention, an increase of the surface A of the antenna has an amplifying effect on the measuring signal. When very small antennas are used, the measuring values may be amplified.

When using the measuring system in an industrial process, several sensors, i.e. antennas and detectors may be disposed in various desired points of the process. Individual antennas disposed in the process can also be interconnected either directly or by a wire or a capacitor between the antennas. The measuring values from these are preferably conducted to a common processor unit for signal processing and evaluation.

When the strength of an electric field in a measuring object or test material which does not move, or moves with a very small velocity, is to be measured by means of the antenna, the antenna itself can be brought into a slow, e.g. 1–100 cm/s, motion of long amplitude, e.g. 1–100 cm, in the electric field of the measuring object. The movement, which may be three-dimensional, in relation to the measuring object can then easily be defined as to its velocity and coordinates, by measuring these or by determining the movement in some other way. The motion of the antenna can be adapted to the shape of the measuring object. If there are several antennas, the movements of them can be coordinated so that the movements together cover a desired portion of the whole surface of the measuring object.

The detector 14 in FIG. 2 is connected to the voltage meter 18 via a signal cable 16, e.g. a normal coaxial cable, such as the RG62 cable. In practice, the capacitor 30 may in some cases be substituted by a long cable, e.g. 50–300 m long. The losses in the cable are small, the voltage losses are far below the resolution of an A/D converter. FIG. 3 illustrates schematically a measuring system according to the invention, in which the capacitor is substituted by a long cable 32. The resistor 28 is connected to the cable in the capacitor circuit 14. The voltage meter 18 is disposed in the computer 20, which constitutes the processor unit of the measuring system. A monitor 21 and a recorder 21' is connected to the computer. The measuring system can also be connected to a central control system, e.g. by way of a computer network.

When the voltage U over the detector circuit has been measured and digitized via an A/D converter with an even interval dt, dU/dt can be calculated from $$dU=U_k-U_{k-1},$$

where $U_k$ and $U_{k-1}$ are the values of two subsequent values of U with a time interval of dt.

The electric field caused by the charges $Q_i$, which is to be detected, can then be calculated as follows:

The electric field E is the sum of discrete charges (i)

$$E=\Sigma Q_i/(4.0*\pi*\epsilon_0*r^2)$$

The electric field E causes a so called electric displacement D in the antenna, which leads to the following functional relationship $$D=\epsilon_0*E=Q_a/A$$

where A is the surface of the antenna.

The charge concentration $Q_a$ in the antenna can then be calculated from $$Q_a = \epsilon_0 * A * E$$

$$Q_a = -Q_a$$

The currents I, $I_C$ and $I_R$ are added according to Kirchoff's law $I = I_C + I_R$ and the currents are defined as $$I_R = U/R$$

$$I_C = C * dU/dt$$

$$I = dQ_a/dt = \epsilon_0 * A * dE/dt$$

This leads to the following differential equations $$dE/dt = U/(\epsilon_0 * A * R) + (C/\epsilon_0 * A) * dU/dt$$

$$U = \epsilon_0 * R * A(dE/dt) - R * C * (dU/dt)$$

$$dU/dt = (\epsilon_0 * A/C) * (dE/dt) - U/(R * C)$$

in which equations $\epsilon_0$ = dielectric constant of vacuum

R = value of the resistance of the capacitor circuit

A = surface of the antenna

C = value of the capacitance of the capacitor circuit dt = time interval between the measuring points The above equations give dE/dt, when U and dU/dt are known, hereafter E can be calculated by integrating the equation $$E = E_0 + f(dE/dt) * dt$$

The charge distribution can be calculated when the position and the movement function of the charges in relation to the antenna in a three-dimensional space are known.

The measuring process in the measuring system according to the invention is carried out in the following way:

a certain number of measuring points, preferably >100, and typically 540 measuring points, are read off in each voltage meter with a sensor at a sampling time dt=0.0065025 s. The measuring signals are digitized in the A/D converter in the processor unit, whereafter the signals from the measuring points, which constitute a data vector, are processed in the processor unit to one measuring value, and these measuring values are presented as measuring data and are used for further processing for producing trends, controlling processes, etc.

In the first stage, e.g. 540 measuring points are digitized during a period of e.g. 3.5 s. The data vector thus obtained is processed in the second stage signal processing, in which a numerical value is obtained for the electric field detected by the antenna. This value represents a measure of the strength of the electric field and the variation during the period of 3.5 s.

In the signal processor the standard deviation of the measuring points (540) in a certain frequency band are calculated, e.g. by means of Fourier's analysis. The frequency band is chosen on the basis of external interference and the dynamics of the process so that the external interference is eliminated as far as possible. In the signal processor of the processor unit, the standard deviation of measuring points in a certain desired frequency band are calculated, whereas the standard deviation in another undesired frequency band containing, e.g. known external interference, are excluded from the calculation, the effect of external interference on the measuring result thus being eliminated. E.g. a standard deviation for the frequency bands 0.0–45 Hz and 55–70 Hz can be calculated, known interference at 50 Hz then having been efficiently excluded from the result.

The measuring signal can, by means of frequency analysis in the processing unit, be divided into two main groups, AC (the alternating current component) and DC (the direct current component). These main groups can further be divided into several subgroups. By analysis of the groups, various information about the measuring object (test material) or the process can be obtained.

Due to asymmetric movement of the measuring object (test material) during the passage past or towards the antenna, besides an AC component, also a DC component of the term dE/dt is received. The AC component of dE/dt is obtained mainly because of cyclic changes in the paths of motion of the measuring object, or gradients in the charge distribution for the measuring object, gradients in the velocity of the measuring object, etc.

It has been found that by analysis of the DC and AC groups separately and by analysis of their ratio, it is possible to distinguish between types of origin of changes in the measuring signals.

A clear correlation between measurements and the chemical components of the measuring object (test material) has been found. By analysis of the AC and DC groups, the chemical and physical conditions of the measuring object can be observed and thus be controlled in such a way that e.g. a chemical reaction proceeds optimally.

In the measuring system according to the invention, the big resistance R can bring about a bias voltage $U_b$ in the voltage meter, i.e. a displacement of the zero level which can amount to some volts, e.g. 3.5 V. The bias current $I_b$ is defined as $I_b = U_b/R$, which means that a big resistance R despite a small current $I_b$ can give a high $U_b$. If the measuring range of the voltage meter is e.g. ±5.0 V, a displacement of the zero level of 3.5 V is unacceptable. The bias current can according to the invention be zeroed off by a current $I_b'$, which is defined as $I_b' = -I_b$. The biasing is brought about by way of a biasing unit which is connected to the detector and controlled by the processor unit. The bias level can also be moved for measuring technical reasons.

Figure 4:
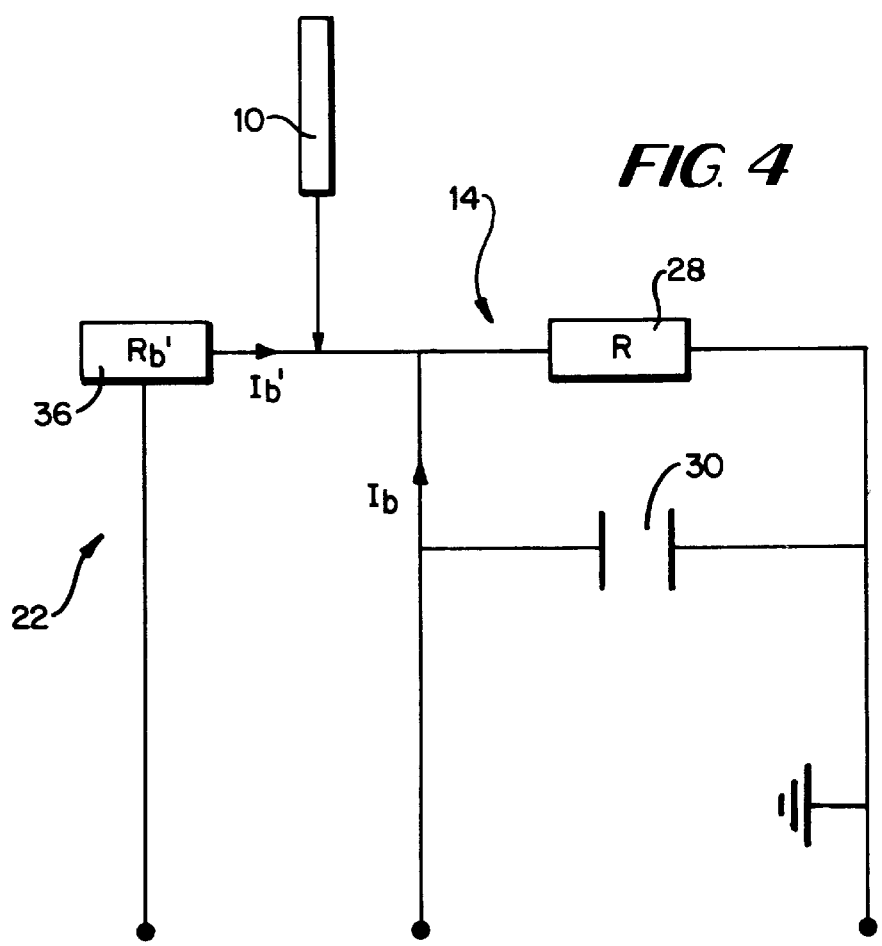

FIG. 4 illustrates a biasing unit with a resistor ($R_b'$) 36 connected to the detector 14. The resistor in the biasing unit is preferably chosen so that the current ($I_b'$) through it compensates the current ($I_b$) over the resistor (R) 28 in the capacitor circuit, the voltage (U) over the resistance becoming=0 when no external signal is present. The resistance ($R_b'$) 36 of the biasing circuit has a value which preferably is often nearly equal to the value of the resistance 28 in the capacitor circuit. The magnitude of the circuit ($I_b'$) in the biasing circuit is controlled by the processor unit according to the magnitude of the electric field E. The measuring system according to the invention may comprise several biasing units, each connected to a sensor.

According to the invention the measuring result of a measurement of the static electricity or the change in the electric field of a measuring object may preferably be used optimizing a process which as a component contains the measuring object.

It has been found that the measuring system according to the invention advantageously can be used for measuring the static electricity of flowing suspensions of solid matter, and the measuring result can be used as a control parameter for controlling mechanical or chemical treatment or heat treatment of the solid matter.

The measuring result of a measurement of the static electricity or the change in a electrical field of a measuring object (test material) can also be used for analysing the chemical and/or physical condition of the measuring object, which can be solid, liquid or gaseous, and thus used for controlling a process containing the measuring object (test material). By measuring the electric field and its changes, the physical and chemical properties of the end product can be controlled by controlling, on the basis of the measuring result, the amount of additives, the velocity of the measuring object and thus the energy of collision with the surroundings, the flow profile of flowing particles etc., and thereby obtain an end product having desired properties.

The measuring result according to the invention may well be used for direct control of chemical processes. A prerequisite for two components A and B to react with each other is that they do not repel each other. A repulsion which takes place between particles having the same polarity renders a reaction between the particles impossible or at least more difficult. The Coulomb forces prevent e.g. van der Waals bindings from forming. It has now been found that the charge conditions of the reacting materials change as a function of the progress of the reaction. This renders it possible to determine the condition of the reaction and the need of possible control measures by measuring the charge of the reacting materials.

The measuring system according to the invention is especially adapted to be used in industrial processes under severe conditions. The sensibility of the system is amply sufficient and the antennas can easily be designed to meet the special requirements that may be found in various processes. The processor unit takes efficiently care of the measuring logic as well as the measuring signals.

When the measuring system is used for measuring the charges of powder flowing in a channel, the signal processing unit of the measuring system is capable of distinguishing between the portion of the signals which originates from the flow and the changes thereof and the portion which originates from fluctuations of the charge. The measurement is capable of giving many-sided information about e.g. the flow rate of the powder, the degree of turbulence and the volume flow.

The flow rate is e.g. measured by placing two identical antennas in the flow channel, symmetrically a certain distance apart from each other. Each antenna is connected to a channel in the meter and a phase angle analysis between the signals is carried out. When the distance between the antennas is known, the velocity can be calculated. It is also possible to connect the two antennas to the same channel in the meter, whereby an additional line in the Fourier analysis of the signal processing unit is obtained, the frequency of which is dependent on the distance between the interconnected antennas.

The measuring system may advantageously be used e.g. for controlling the supply of additives in a process, controlling the reaction time of a process, controlling the degree of grinding of the starting material in a process, controlling the supply of heat to a process and/or for controlling a combustion process by controlling the charge conditions of the input material on the optimum level.

The grinding process is a typical example of a process in which measurement of the electric field of the particles can be used for controlling the process. During grinding, triboelectric charging, or the so called frictional charging of the particles, is brought about in the dielectric material when the particles come into contact with each other and/or other material particles. The charges are produced on the surface of the material, the specific surface of the material having a vital significance for the charging of the material.

The static electricity of the particles exerts forces on other charged particles that come in the vicinity of them. When particles having charges of different polarity come near each other, attractive forces are produced between them. When the attractive forces are sufficiently big, the particles are attracted to each other and form agglomerates. Similarly, forces are produced between surfaces and particles close by having different polarities. If the forces are big enough, coatings are formed on the surfaces.

Agglomerates and coatings on surfaces easily cause disturbances in grinding processes. During grinding, free surfaces are formed that often become highly charged. The surfaces of the particles are charged with different polarities, which results in agglomeration of the particles. Agglomeration and coating of surfaces can be prevented by using grinding agents. The grinding agent is a polar material in liquid form. The electric field from a positively charged particle turns the molecules of the grinding agent so that the negative pole is drawn towards the field. Similarly, the positive pole of the grinding agent is drawn towards a negatively charged particle. The grinding agent is drawn to the surface of the particle preventing thus other particles from adhering to the particle, i.e. it prevents agglomeration and coating of surfaces. The grinding agent means an additional cost which should be kept as low as possible.

Agglomerates of particles produce weaker electric fields than corresponding particles with addition of a grinding agent, as the charge of different polarities cancel each other out. By measuring the electric field in accordance with the invention, it is possible to get an idea of the degree of the agglomeration of the material and/or get an idea of the requirements of grinding agent. The measuring system may be used for controlling the addition of grinding agent.

On the other hand, as the specific surface of particles is a square-law function of the diameter, i.e. the smaller the particle diameter is, the greater is the specific charge of the material per kg of mass, a measurement of the electric charge can also give an idea of the degree of grinding. The measuring system according to the invention may be used for controlling e.g. the dwell time in the grinder.

An electrically charged powder forms a so called static electric cushion, on which the particles slide without touching each other very strongly. Static electricity can thus provide good flow properties for some powders. The stronger the electric field brought about by the particles of the powder is, the better flow properties the powder can be expected to have. Measurement of the electric field thus also gives an indication of the flow properties of the powder.

The measuring system according to the invention can well be used for on-line controlling of grinding processes, e.g. grinding of lime. The object of the grinding is to maintain an even quality of the powder with a certain size distribution of the particles without agglomerates. Several different variables have an effect on the particle size, such as e.g. the flow of the material, the dwell time in the grinder, the temperature, the mean content of grinding agents, the vacuum in the grinder, the separation stages, etc. These variables are strongly interconnected, which makes the controlling of the grinding a very complicated process and makes it difficult to obtain a product specification with narrow variations. By means of the measuring system according to the invention the effect of each variable on the product, i.e. on the electric field of the product can easily and rapidly be observed. By varying the frequency band for the standard deviation, the effect of the desired variable can be controlled. The measuring system thus makes it possible to optimize the grinding process. It is e.g. possible to maintain the process optimal even if some variable is changed by compensating it with another variable.

Often coal which is ground for combustion has to be dried before grinding it. The moisture content, the particle size and, above all, the amount of agglomerate in the supplied coal spray, i.e. the suspension of coal, air and steam, have major significance for the efficiency of the combustion. The charge balance in the spray is probably also of some significance at the combustion. The charge balance is dependent on the charges of the coal spray. The grinding of the coal and the additives, if any, and the preparation of the coal spray can by means of the measuring system according to the invention be controlled so that the formation of agglomerates is prevented or at least considerably reduced and so that the charges of the spray are kept on an appropriate level.

The measuring system is able to identify the flow and the flow properties of a measuring object. It is by means of the signal processing of the measuring system possible to distinguish between, on one hand, the portion of the signals which originates from the flow and the changes thereof and, on the other hand, the portion which originates from fluctuations of the charge. This can be used to obtain information about powder suspensions/gas suspensions as regards the flow rate of the powder, the turbulence degree and the flow volumes. The measuring system is also capable of giving information about vibrations in the measuring object and the acceleration of the same. This information can then be used in the process to take care of arising problems, e.g. to prevent undesired agglomeration or contamination.

At the measuring procedure, two identical antennas can be disposed in the middle of the flow channel, at a certain distance from each other. Each antenna may be connected to a measuring channel and a phase angle analysis is carried out between the signals produced in this way. As the distance between the antennas is known, the velocity can be calculated. The antennas can alternatively be interconnected to the same channel, an additional line whose frequency is dependent on the distance between the interconnected antennas being obtained at the signal processing (by e.g. Fourier analysis).

The measuring system can thus be used for measuring the velocity, the volume or mass flows, the ratio between gas and powder and/or the degree of turbulence in e.g. suspensions of pulverized coal, the measuring result which gives specific information about the coal preparation process being utilized to control the said process.

The measuring system can be used in a corresponding manner for measuring the velocity, the amount of particles and/or the flow geometry of gas in flue gas flows. The information obtained in this way can thereafter be utilized for controlling the combustion process, the flue gas cleaning or some other part of the entire process.

The measuring system according to the invention can also be used for optimizing the combustion process in a combustion furnace. By measuring the properties of the flue gas, information about the combustion process is obtained, so that e.g. the supply of air or oxygen and the supply of fuel or additives to the furnace can be controlled optimally.

It has been found that the measuring system according to the invention may advantageously be used in paper making for measuring and controlling the properties of the paper, such as the charge. The charge affects the running of the paper e.g. through copying machines and the copying itself. By means of the measuring system is it possible to optimally control the content of pulp, additives and coating material in the stock at the paper manufacture stage and/or to control the paper machine itself in order to obtain paper having desired properties.

The measuring system can also be used to obtain signals about static electricity in the liquid tanks of ships so that measures can be taken so as to prevent undesired discharging.

The invention is not limited to the embodiments described and illustrated above, but can be varied in many ways within the scope and spirit of the invention, which is defined in the appended claims. By the term measuring object is to be understood the most varying systems in which static electricity can be measured, such as suspensions of particles, solid bodies, material webs, gases, liquids etc.

I claim:

1. A measuring system for detecting at least one of static electricity and change of static electricity in an object, comprising:

a voltage meter which reads charge measuring values;

a processor unit with a signal processing unit connected to said voltage meter;

at least one sensor comprising: a sensing element positionable with respect to an object to be evaluated so that the electric field of the object induces in said sensing element an electric signal indicating a change in electric charge which is proportional to the electric charge of the object; and a detector comprising a capacitor circuit having a capacitance connected between said sensing element and said voltage meter for transmitting to said voltage meter the signal induced in said sensing element indicating a change in electric charge, for measuring the change in the charge; and a resistance R connected in parallel with said capacitor circuit so that the time constant $T=R*C$ of said capacitor circuit at discharge falls within the range of 0.01–5 seconds, so that said capacitor circuit has an integrating effect on the measuring values which are read by said voltage meter.

2. A measuring system according to claim 1 wherein said resistance R is connected to said capacitor circuit so that the time constant $T=R*C$ of said capacitor circuit falls within the range of 0.1–1 seconds.

3. A measuring system according to claim 1 wherein the capacitance C of said capacitor circuit is 1–50 nF, and wherein said capacitor circuit includes a resistance between 1–100 Mohm.

4. A measuring system according to claim 3 wherein said detector further comprises a signal cable which transmits current induced in said sensing element to said voltage meter, said signal cable having a capacitance between 1–50 nF.

5. A measuring system according to claim 1 wherein said voltage meter transmits measuring signals for more than 100 digitized measuring points, for calculation of a numerical value of the electrical field E of the object for a given time period, to said signal processing unit so that said voltage meter reads measuring values in a time interval dt of less than 0.01 seconds for a time period of between 1–10 seconds.

6. A measuring system according to claim 1 further comprising a biasing unit, which is controlled by said processor unit, connected to said detector for compensating the current (I) over a resistor in said capacitor circuit, so that the voltage over the resistor in said capacitor circuit=0 when no external signal is present, so that a biasing current ($I_b$) is conducted from said biasing unit to said detector over a biasing resistor ($R_b$'), the value of which corresponds to the value of said resistor in said capacitor circuit, and wherein the magnitude of the biasing current ($I_b$) is controlled according to the magnitude of the electric field (E).

7. A measuring system according to claim 6 wherein said measuring system comprises a plurality of sensors and biasing units, each biasing unit being connected to one of said sensors.

8. A system as recited in claim 1 which analyzes at least one of the chemical and physical conditions of an object; and further comprising means for using the integrated measuring values read by said voltage meter to determine at least one of the chemical and physical characteristics of an object.

9. A system as recited in claim 1 in combination with an object comprising at least one of a powdery medium, flowing gas, and web of material.

10. A method of detecting at least one of static electricity and a change thereof in an object to be evaluated, utilizing a measuring system including a voltage meter which reads measuring values, a processor unit with signal processing, connected to the voltage meter, and at least one sensor comprising a sensing element and a detector, the detector comprising a capacitor circuit; said method comprising:

(a) positioning a sensing element in or near the object to be evaluataed so that the electric field of the object induces an electric signal in the sensing element indicating a change in electric charge, which signal is proportional to the electric charge of the object;

(b) using the capacitor circuit to transmit the signal induced in the sensing element to the voltage meter; and (c) integrating the measuring values which are read by the voltage meter by practicing (b) utilizing a resistance R connected in parallel with the capacitor circuit so that the time constant T=R*C of the capacitor at discharge is within the range of 0.01–5 seconds.

11. A method according to claim 10 further comprising (d) substantially eliminating the affect of external interference on the result achieved by calculating in the signal processing unit the standard deviation for measuring points in a certain desired frequency band while excluding from the calculation the standard deviation for measuring points in another, undesired, frequency band.

12. A method according to claim 10 wherein (a) is practiced by moving the sensing element in a slow motion, having a long amplitude in the electric field.

13. A method according to claim 10 wherein (a) is practiced by moving the sensing element relative to the object in a well-defined, velocity and coordinate known, manner.

14. A method according to claim 10 wherein (a) is practiced by controlling the sensing element with the signal processing unit to detect a representative field of each charged partial area of the object, and then using the signal processing unit to compile a representative value of the change in the entire charge of the object.

15. A method according to claim 10 wherein (c) is practiced by using a coaxial cable having a capacitance greater than one nF to which a resistor having a resistance of greater than one Mohm is connected so that the time constant T=R*C of the capacitor circuit is between 0.1–1 seconds.

16. A method according to claim 10 wherein the signal processing unit includes an A/D converter; and wherein (a) and (c) are further practiced by transmitting from the voltage meter via the A/D converter a series of measuring values read within a predetermined time interval during a predetermined period of time, in digital form, and wherein the time interval is less than 0.01 seconds and the time period is between 1–10 seconds.

17. A method as recited in claim 16 further comprising (d) substantially eliminating the affect of external interference on the result achieved by calculating in the signal processing unit the standard deviation for measuring points in a certain desired frequency band while excluding from the calculation the standard deviation for measuring points in another, undesired, frequency band.

18. A method as recited in claim 10 further comprising (d) using the measuring result of the measurement of at least one of the static electricity or the change in the electric field of the object to optimize a process utilizing the object as a component.

19. A method as recited in claim 18 wherein (a)–(c) are practiced to measure at least one of the static electricity or the change in electric field of a flowing suspension of solid matter; and further comprising using the result measured for controlling mechanical, chemical, or heat treatment of the solid matter of the suspension.

20. A method as recited in claim 18 further comprising using a measuring result from (a)–(c) to analyze at least one of the chemical and physical condition of the object, and then controlling a process containing the object after analyzing at least one of the physical and chemical conditions thereof.

21. A method as recited in claim 18 further comprising using the measuring result from (a)–(c) to control at least one of: the supply of starting material to a process; the supply of additives to the process; the reaction time of the process; the degree of grinding of the starting material in the process; the supply of heat to a process; and combustion in the process.

22. A method as recited in claim 18 wherein (a)–(c) are practiced utilizing a paper web in a paper making machine as the object; and further comprising using the measuring result from (a)–(c) to control at least one of the stock fed to the paper making machine, and the operation of the paper making machine.

23. A method as recited in claim 18 wherein (a)–(c) are used to measure at least one of the velocity, the volume flow, the mass flow, the ratio between gas and powder, and the degree of turbulence, in a suspension of powder.

24. A method as recited in claim 18 wherein (a)–(c) are practiced to measure at least one of the velocity, the amount of particles, and the flow geometry, of flue gases.

25. A method as recited in claim 18 wherein (a)–(d) are practiced using a powdery medium as the object.

26. A method as recited in claim 18 wherein (a)–(d) are practiced using a flowing gas as the object.

27. A method as recited in claim 18 wherein (a)–(d) are practiced using a web of material as the object.

28. A method as recited in claim 10 wherein (a)–(c) are practiced using at least one of a powdery medium, flowing gas, and web of material as the object.

* * * * *